(12) United States Patent
Kwon

(10) Patent No.: US 6,856,204 B2
(45) Date of Patent: Feb. 15, 2005

(54) PHASE LOCKED LOOP CIRCUIT HAVING WIDE LOCKED RANGE AND SEMICONDUCTOR INTEGRATED CIRCUIT DEVICE HAVING THE SAME

(75) Inventor: Hyeok-chul Kwon, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/371,455

(22) Filed: Feb. 21, 2003

(65) Prior Publication Data

US 2003/0222722 A1 Dec. 4, 2003

(30) Foreign Application Priority Data

May 28, 2002 (KR) ........................................ 2002-29605

(51) Int. Cl.[7] .......................... H03L 7/085; H03L 7/099
(52) U.S. Cl. ............................ 331/17; 331/34; 331/179
(58) Field of Search ............................. 331/1 A, 8, 10, 331/11, 12, 16, 17, 18, 25, 34, 177 R, 179, DIG. 2; 327/158–159; 332/127; 360/51; 375/376; 455/260

(56) References Cited

U.S. PATENT DOCUMENTS

| | | | |
|---|---|---|---|
| 5,382,922 A | * | 1/1995 | Gersbach et al. ............ 331/1 A |
| 6,150,886 A | | 11/2000 | Shimomura .................... 331/2 |
| 6,188,289 B1 | * | 2/2001 | Hyeon ......................... 331/17 |

FOREIGN PATENT DOCUMENTS

| | | | |
|---|---|---|---|
| JP | 11-88156 | 3/1993 | ........... H03L/7/081 |
| JP | 8148998 | 6/1996 | ............. H03L/7/10 |
| JP | 10-98378 | 4/1998 | ........... H03L/7/087 |
| JP | 11-55112 | 2/1999 | ............. H03L/7/10 |
| JP | 00-49604 | 2/2000 | ............. H03L/7/22 |
| JP | 00-124802 | 11/2000 | ............. H03L/7/07 |

* cited by examiner

Primary Examiner—David Mis
(74) Attorney, Agent, or Firm—Mills & Onello, LLP

(57) ABSTRACT

Provided are a phase locked loop (PLL) circuit having a wide locked range and a semiconductor integrated circuit (IC) device having the PLL circuit. The provided PLL circuit includes a phase/frequency detector for detecting a phase difference between an external input signal and an output signal of the PLL circuit; a charge pump for increasing or decreasing an output voltage level in response to the output signal of the phase/frequency detector; a loop filter for removing a high frequency element from the output voltage of the charge pump; a voltage controlled oscillation unit for outputting a signal having a predetermined frequency as an output signal of the PLL circuit in response to the output voltage of the loop filter; and a voltage controlled oscillator (VCO) range shift unit for decreasing a sensitivity of the output signal of the PLL circuit to the output voltage of the loop filter by increasing or decreasing an internal current of the voltage controlled oscillation unit in response to the output voltage of the loop filter. Accordingly, a jitter generated in the output signal of the PLL circuit decreases even when a noise voltage is input to the output voltage of the loop filter.

14 Claims, 8 Drawing Sheets

PHASE LOCKED LOOP CIRCUIT HAVING WIDE LOCKED RANGE AND SEMICONDUCTOR INTEGRATED CIRCUIT DEVICE HAVING THE SAME

BACKGROUND OF THE INVENTION

This application claims the priority of Korean Patent Application No. 2002-29605, filed May 28, 2002, which is incorporated herein in its entirety by reference.

1. Field of the Invention

The present invention relates to a phase locked loop (PLL) circuit, and more particularly, to a PLL circuit having a wide locked range and a semiconductor integrated circuit (IC) device having the same.

2. Description of the Related Art

In order to obtain a PLL circuit having a wide locked range, a frequency oscillation band of a voltage controlled oscillator (VCO) included in a PLL circuit has to be widened and the sensitivity of the PLL circuit has to be increased within a provided direct current (DC) operational voltage range, i.e., a range between a power supply voltage VDD and a power voltage VSS. When the sensitivity of a PLL circuit increases, an output signal of the PLL circuit becomes sensitive to a noise voltage input into an output voltage of a loop filter so that jitter generated in the output signal of the PLL circuit increases. A noise voltage may be input from a circuit adjacent to the loop filter or a semiconductor device adjacent to the PLL circuit.

FIG. 1 is a block diagram illustrating a conventional PLL circuit. Referring to FIG. 1, a PLL circuit 101 includes a phase/frequency detector 111, a charge pump 121, a loop filter 131, and a voltage controlled oscillation unit 141.

The sensitivity Fvco_sens of an output signal Fvco of the PLL circuit 101 to an output voltage Vfilter of the loop filter 131 is given by Equation 1.

$$Fvco\_sens[Hz/V] = [(Vfilter \times Kvi) + Idc] \times Kosc \quad (1)$$

Here, Kvi denotes a current Ivi transform coefficient for an input voltage of a voltage to current (VI) converter, which is included in the voltage controlled oscillation unit 141 excluding an oscillator. Kosc is a frequency variation correlation coefficient of the oscillator for an output current of the VI converter. In addition, it is assumed that the sizes of transistors included in a current mirror of the voltage controlled oscillation unit 141 are the same.

A graph illustrating the sensitivity of a signal Fvco output from the PLL circuit 101 is shown in FIG. 2. With reference to FIG. 2, the output signal Fvco of the PLL circuit 101 varies linearly with an output voltage Vfilter from the loop filter 131. Here, the gradient of the sensitivity 211 is very steep.

Since the gradient of the sensitivity 211 of the output signal Fvco from the PLL circuit 101 is steep, when a noise voltage Vnoise is input to the output voltage Vfilter of the loop filter 131, jitter is increased in the output signal Fvco of the PLL circuit 101.

Referring to FIG. 3, when a noise voltage Vnoise is input into the output voltage Vfilter of the loop filter 131, jitter f1 generated in the output signal Fvco of the PLL circuit 101 increases in proportion to the noise voltage Vnoise.

As described above, although a conventional PLL circuit 101 can attain a wide locked range due to an increased sensitivity 211 of the PLL circuit 101, a jitter f1 generated in an output signal Fvco of the PLL circuit 101 increases when a noise voltage Vnoise is input to an output voltage Vfilter of a loop filter 131.

SUMMARY OF THE INVENTION

To solve the above-described problems, it is an objective of the present invention to provide a phase locked loop (PLL) circuit having a wide locked range and decreasing jitter in an output signal of a loop filter even when a noise voltage is induced into the output signal It is another objective of the present invention to provide a semiconductor integrated circuit (IC) device including a PLL circuit having a wide locked range and decreasing jitter in an output signal of a loop filter even when a noise voltage is induced into the output voltage.

To accomplish the above objective of the present invention, a PLL circuit in accordance with the invention having a wide locked range comprises a phase/frequency detector for detecting a phase difference between an external input signal and an output signal of the PLL circuit, a charge pump for increasing or decreasing an output voltage level in response to the output signal of the phase/frequency detector, a loop filter for removing a high frequency element from the output voltage of the charge pump, a voltage controlled oscillation unit for outputting a signal having a predetermined frequency as an output signal of the PLL circuit in response to the output voltage of the loop filter, and a voltage controlled oscillator (VCO) range shift unit for decreasing a sensitivity of the output signal of the PLL circuit to the output voltage of the loop filter by increasing or decreasing an internal current of the voltage controlled oscillation unit in response to the output voltage of the loop filter.

It is preferable that the PLL circuit further include a frequency divider for dividing the frequency of the output signal of the PLL circuit by a predetermined number and applying the divided frequency to the phase/frequency detector.

It is preferable that the VCO range shift unit include a node connected to the voltage controlled oscillation unit for receiving and outputting an output current of the VCO range shift unit, a first current source connected to a power supply voltage, a first switch connected between the first current source and the node, a second current source connected to the ground voltage, a second switch connected between the node and the second current source, a first comparison unit receiving the output voltage of the loop filter and a first reference voltage for turning on the first switch by outputting a high voltage level when the output voltage of the loop filter is lower than the first reference voltage and turning off the first switch according to an opposite state, and having a hysteresis characteristic; and a second comparison unit receiving the output voltage of the loop filter and a second reference voltage for turning on the second switch by outputting a high voltage level when the output voltage of the loop filter is higher than the second reference voltage and turning off the second switch according to an opposite state, and having a hysteresis characteristic. Here, the first reference voltage level is lower than the second reference voltage level and the first and second switches are turned off when the output voltage of the loop filter is higher than the first reference voltage and lower than the second reference voltage.

It is preferable that an output current of the first current source flows into the voltage controlled oscillation unit when the first switch is turned on and the second switch is turned off, a predetermined current flows out from the voltage controlled oscillation unit to the second current source when the first switch is turned off and the second switch is turned on, and no current flows into or out from the voltage controlled oscillation unit when the first and second switches are turned off.

It is preferable that the first comparison unit includes a first resistor connected to the first reference voltage, a third switch connected to the first resistor, a third current source connected to the third switch, and a first comparator having an inverting input terminal and a non-inverting input terminal, in which the first resistor is connected to the non-inverting input terminal and the output voltage of the loop filter is input to the inverting input terminal, for turning on the third switch by outputting a high voltage level as an output voltage of the first comparison unit when the output voltage of the loop filter is lower than the voltage input to the non-inverting input terminal so as to allow the output current of the third current source to flow through the first resistor, and for turning off the third switch by outputting a low voltage level as the output voltage of the first comparison unit when the output voltage of the loop filter is higher than the voltage input to the non-inverting input terminal so as to represent a hysteresis characteristic.

It is preferable that the second comparison unit include a second resistor connected to the second reference voltage, a fourth switch connected to the second resistor, a fourth current source connected to the fourth switch, and a second comparator having an inverting input terminal and a non-inverting input terminal, in which the second resistor is connected to the inverting input terminal and the output voltage of the loop filter is input to the non-inverting input terminal, for turning on the fourth switch by outputting a high voltage level as an output voltage of the second comparison unit when the output voltage of the loop filter is higher than the voltage input to the inverting input terminal so as to allow the current flowing through the second resistor to flow into the fourth current source, and for turning off the fourth switch by outputting a low voltage level as the output voltage of the second comparison unit when the output voltage of the loop filter is lower than the voltage input to the inverting input terminal so as to represent a hysteresis characteristic.

It is preferable that the voltage controlled oscillation unit include a conversion unit for converting the output voltage of the loop filter into a current, a fifth current source connected to the conversion unit in parallel for outputting a constant current, a current mirror having a first output terminal connected to the conversion unit, and an oscillator for outputting an output signal of the PLL circuit in response to an output current of a second output terminal of the current mirror.

In accordance with another aspect of the present invention, a semiconductor IC device including a PLL circuit having a wide locked range comprises a first pad for receiving an external signal, a phase/frequency detector for detecting a phase difference between the signal input through the first pad and an output signal of the PLL circuit, a charge pump for increasing or decreasing an output voltage level in response to the output signal of the phase/frequency detector, a loop filter for removing a high frequency element from the output voltage of the charge pump, a voltage controlled oscillation unit for outputting an output signal of the PLL circuit in response to the output voltage of the loop filter, a second pad for transmitting the output signal of the voltage controlled oscillation unit to the outside, and a VCO range shift unit for decreasing a sensitivity of the output signal of the PLL circuit to the output voltage of the loop filter by increasing or decreasing an internal current of the voltage controlled oscillation unit in response to the output voltage of the loop filter.

According to the present invention, jitter generated in an output signal of a PLL circuit decreases even when a noise voltage is input to an output voltage of a loop filter.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will now be described more fully with reference to the accompanying drawings, in which preferred embodiments of the invention are shown.

Figure 4:
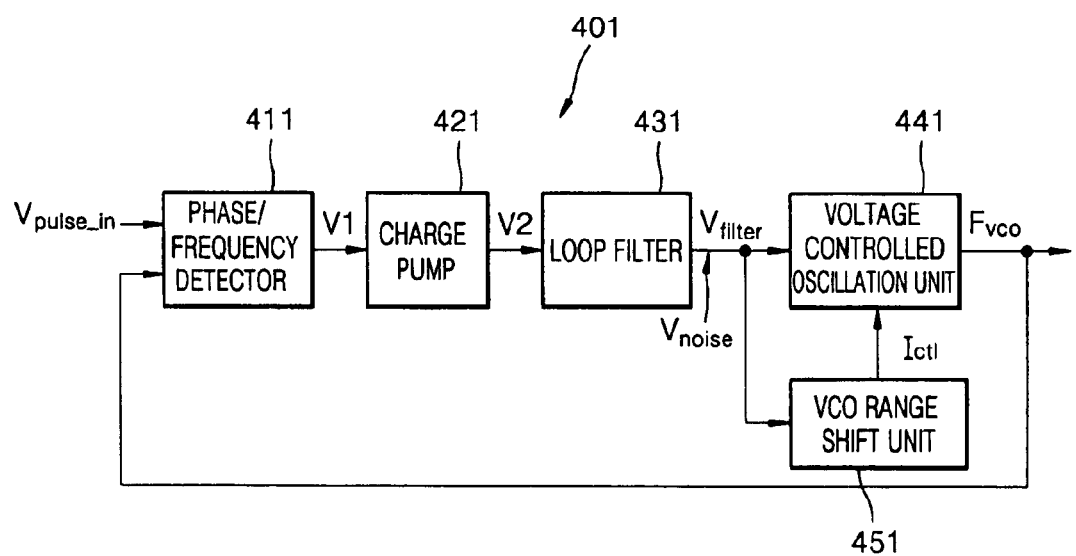
FIG. 4 is a block diagram illustrating a PLL circuit according to the present invention.

FIG. 4 is a block diagram illustrating a phase locked loop (PLL) circuit according to the present invention. Referring to FIG. 4, a PLL circuit 401 includes a phase/frequency detector 411, a charge pump 421, a loop filter 431, a voltage controlled oscillation unit 441, and a voltage controlled oscillator (VCO) range shift unit 451.

The phase/frequency detector 411 detects a phase difference between an external input signal Vpulse_in and an output signal Fvco of the PLL circuit 401 and outputs the phase difference as a direct current (DC) voltage V1. Here, a portion of the output signal Fvco from the PLL circuit 401 is fed back to the phase/frequency detector 411.

The charge pump 421 increases or decreases an output voltage V2 in response to the DC voltage V1 output from the phase/frequency detector 411. For example, when a phase difference between the external input signal Vpulse__in and the output signal Fvco of the PLL circuit 401 is large, the DC voltage V1 from the phase/frequency detector 411 increases so that the charge pump 421 decreases the output voltage V2. When a phase difference between the external signal Vpulse__in and the output signal Fvco of the PLL circuit 401 is small, the DC voltage V1 from the phase/frequency detector 411 decreases so that the charge pump 421 increases the output voltage V2.

The loop filter 431 formed of a low pass filter removes high frequency elements from the output voltage V2 of the charge pump 421 to pass low frequency elements, i.e., a DC voltage.

The voltage controlled oscillation unit 441 receives an output voltage Vfilter of the loop filter 431 and outputs a signal Fvco having a predetermined frequency as an output signal of the PLL circuit 401 depending on the level of the output voltage Vfilter of the loop filter 431.

The VCO range shift unit 451 receives the output voltage Vfilter of the loop filter 431 and transmits an output current Ictl to the voltage controlled oscillation unit 441. When the output voltage Vfilter level of the loop filter 431 is low, the VCO range shift unit 451 supplies the output current Ictl to the voltage controlled oscillation unit 441 to reduce an internal current Ivco of the voltage controlled oscillation unit 441. When the output voltage Vfilter level of the loop filter 431 is high, the output current Ictl flows from the voltage controlled oscillation unit 441 to the VCO range shift unit 451 so as to increase the internal current Ivco of the voltage controlled oscillation unit 441. Accordingly, the sensitivity of the output signal Fvco of the PLL circuit 401 to the output voltage Vfilter of the loop filter 431 is decreased. Therefore, jitter generated in the output signal Fvco of the PLL circuit 401 is small even when a noise voltage Vnoise is input into the output voltage Vfilter of the loop filter 431.

The PLL circuit 401 may further include a frequency divider (not shown) for dividing the frequency of the output signal Fvco of the PLL circuit 401 by a predetermined number N and applying the divided frequency to the phase/frequency detector 411.

Figure 5:
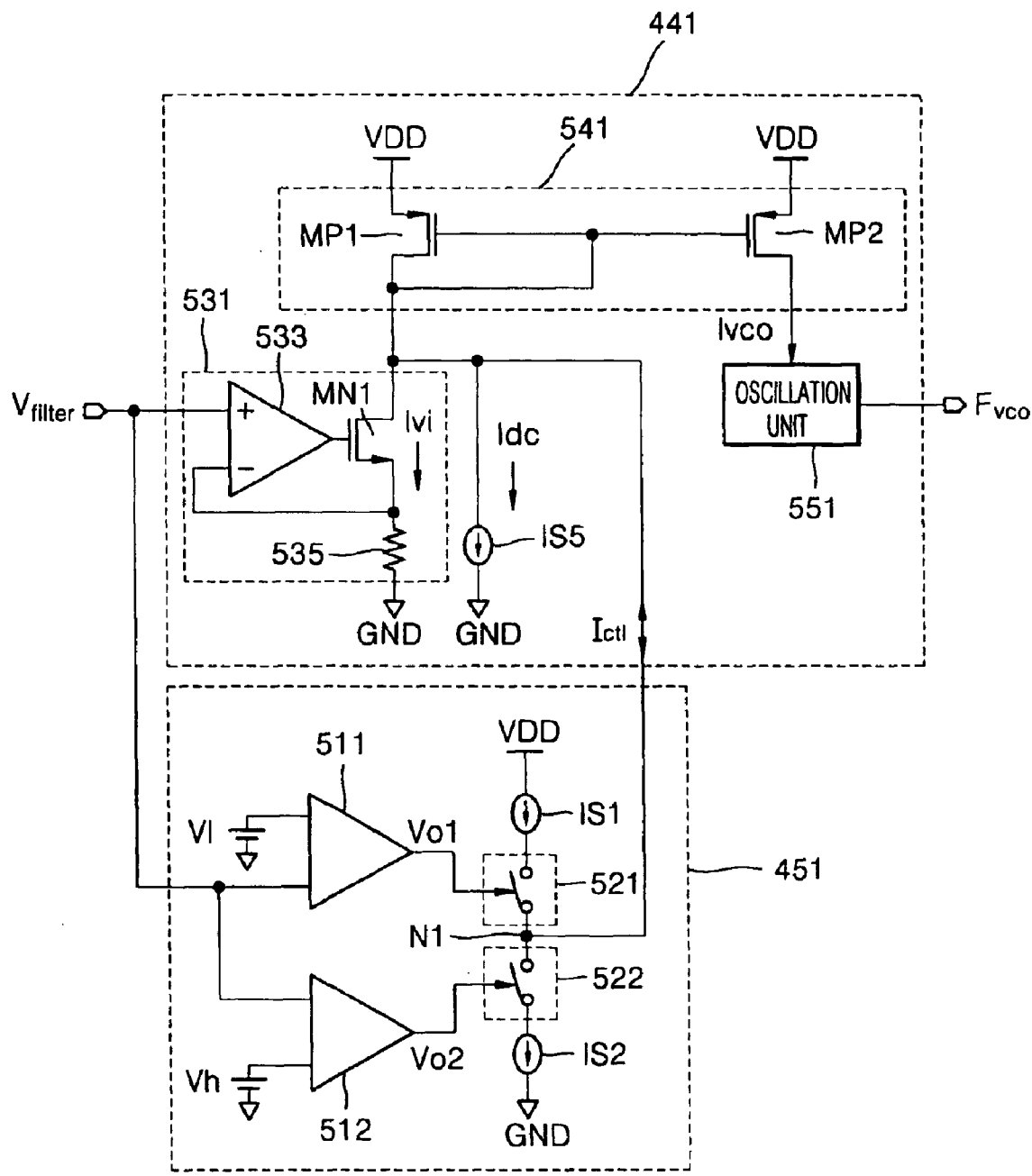
FIG. 5 is a circuit diagram of a voltage controlled oscillation unit and a voltage controlled oscillator (VCO) range shift unit of FIG. 4.

FIG. 5 is a circuit diagram illustrating the voltage controlled oscillation unit 441 and the VCO range shift unit 451 of FIG. 4.

Referring to FIG. 5, the VCO range shift unit 451 includes a node N1, first and second current sources IS1 and IS2, first and second switches 521 and 522, and first and second comparison units 511 and 512.

The node N1 has an electrical connection to the voltage controlled oscillation unit 441.

The first current source IS1 is connected to a power supply voltage VDD and outputs a predetermined first current in a steady state.

The first switch 521 is connected between the first current source IS1 and the node N1.

The second current source IS2 is connected to the ground voltage GND and outputs a predetermined second current in a steady state.

The second switch 522 is connected between the second current source IS2 and the node N1.

The first comparison unit 511 receives the output voltage Vfilter of the loop filter 431 and a first reference voltage Vl.

When the output voltage Vfilter level of the loop filter 431 is lower than the first reference voltage Vl level, the first comparison unit 511 outputs a high voltage, for example, the power supply voltage VDD, to turn on the first switch 521. On the contrary, when the output voltage Vfilter level of the loop filter 431 is higher than the first reference voltage Vl level, the first comparison unit 511 outputs a low voltage, for example, the ground voltage GND, to turn off the first switch 521. Accordingly, the first comparison unit 511 has a hysteresis characteristic based on fluctuation of the output voltage Vfilter of the loop filter 431 above or below the first reference voltage Vl.

The second comparison unit 512 receives the output voltage Vfilter of the loop filter 431 and a second reference voltage Vh. When the output voltage Vfilter level of the loop filter 431 is higher than the second reference voltage Vh level, the second comparison unit 512 outputs a high voltage, for example, the power supply voltage VDD, to turn on the second switch 522. On the contrary, when the output voltage Vfilter level of the loop filter 431 is lower than the second reference voltage Vh level, the second comparison unit 512 outputs a low voltage, for example, the ground voltage GND, to turn off the second switch 522. Accordingly, the second comparison unit 512 has a hysteresis characteristic based on fluctuation of the output voltage Vfilter of the loop filter 431 above or below the second reference voltage Vh.

Here, the first reference voltage Vl level is lower than the second reference voltage Vh level.

In the case where the first switch 521 is turned on and the second switch 522 is turned off, the output current Ictl of the first current source IS1 flows into the voltage controlled oscillation unit 441 so that the internal current Ivco of the voltage controlled oscillation unit 441 is reduced. On the contrary, when the first switch 521 is turned off and the second switch 522 is turned on, the output current Ictl flows from the voltage controlled oscillation unit 441 into the second current source IS2 so that the internal current Ivco of the voltage controlled oscillation unit 441 is increased.

When the output voltage Vfilter level of the loop filter 431 is higher than the first reference voltage Vl and lower than the second reference voltage Vh, the first and second comparison units 511 and 512 output low voltages so that the first and second switches 521 and 522 are turned off. Consequently, the VCO range shift unit 451 is electrically opened to the voltage controlled oscillation unit 441 so that the output current Ictl does not flow from the VCO range shift unit 451 to the voltage controlled oscillation unit 441 nor from the voltage controlled oscillation unit 441 to the VCO range shift unit 451.

The operations of the VCO range shift unit 451 according to the output voltage Vfilter level of the loop filter 431 are listed in Table 1 below.

TABLE 1

| | first switch 521 | second switch 522 | output current Ictl |
|---|---|---|---|
| first section (Vfilter < Vl) | On | Off | increase |
| second section (Vl < Vfilter < Vh) | Off | Off | maintain |
| third section (Vh < Vfilter) | Off | On | decrease |

The sensitivity of the PLL circuit 401 is reduced by the VCO range shift unit 451. Therefore, the amount of jitter generated in the output signal Fvco of the PLL circuit 401 is small even when a noise voltage Vnoise is input to the output voltage Vfilter of the loop filter 431.

Referring to FIG. 5, the voltage controlled oscillation unit 441 includes a conversion unit 531, a fifth current source IS5, a current mirror 541, and an oscillator 551.

The conversion unit 531 converts the output voltage Vfilter of the loop filter 43 into a current Ivi. Here, the conversion unit 531 includes an operational amplifier 533, an NPN transistor MN1, and a resistor 535. When the output voltage Vfilter of the loop filter 431 is input to the operational amplifier 533, the NPN transistor MN1 is turned on so that the current Ivi flows from the current mirror 541 through the resistor 535.

The fifth current source IS5 is connected to the conversion unit 531 in parallel. When the output voltage Vfilter of the loop filter 431 is input to the conversion unit 531, a steady-state current Idc flows through the fifth current source IS5.

First and second output terminals of the current mirror 541 are connected to the conversion unit 531 and the oscillator 551, respectively. The current mirror 541 includes PNP transistors MP1 and MP2; however, the current mirror 541 can include NPN transistors when necessary. When the output voltage Vfilter of the loop filter 431 is input to the conversion unit 531, the PNP transistors MP1 and MP2 are turned on so that the current mirror 541 outputs the output current Ivco through the second terminal.

The oscillator 551 outputs a predetermined frequency signal Fvco, for example, a high frequency signal, as an output signal of the PLL 401 in response to the output current Ivco of the current mirror 541.

The PLL circuit 401 has a wide locked range due to the voltage controlled oscillation unit 441.

Figure 6:
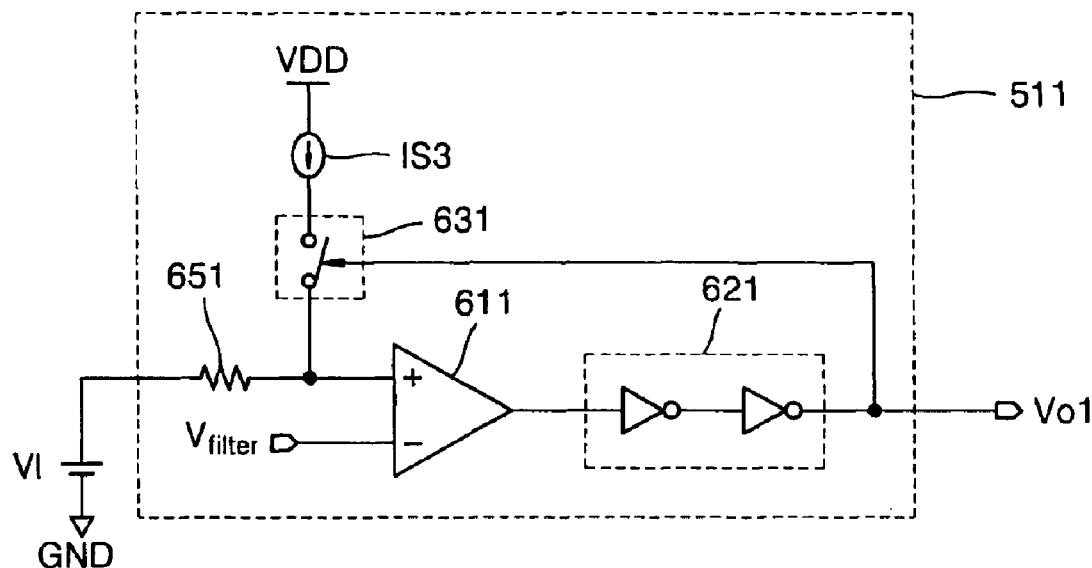
FIG. 6 is a circuit diagram of a first comparison unit of FIG. 5.

FIG. 6 is a circuit diagram illustrating the first comparison unit 511 of FIG. 5. Referring to FIG. 6, the first comparison unit 511 includes a first resistor 651, a third switch 631, a third current source IS3, a first comparator 611, and a buffer 621.

The first resistor 651 is connected to the first reference voltage Vl, the third switch 631 is connected to the first resistor 651, the third current source IS3 is connected to the third switch 631, and the buffer 621 buffers the output of the first comparator 611.

The first resistor 651 is connected to a non-inverting input terminal + of the first comparator 611 while the output voltage Vfilter of the loop filter 431 is input into the inverting input terminal − of the first comparator 611. When the output voltage Vfilter level of the loop filter 431 is lower than the voltage level input to the non-inverting input terminal + of the first comparator 611, the first comparator 611 outputs an output voltage Vo1 of high level, for example, the power supply voltage VDD, so as to turn on the third switch 631. Accordingly, the output current of the third current source IS3 flows into the first resistor 651 through the third switch 631. Therefore, the first reference voltage Vl and the voltage lowered by the first resistor 651 are added and input to the non-inverting input terminal + of the first comparator 611. When the output voltage Vfilter level of the loop filter 431 is higher than the voltage level input to the non-inverting input terminal + of the first comparator 611, the first comparator 611 outputs an output voltage Vo1 of low level, for example, the ground voltage GND, so as to turn off the third switch 631. Accordingly, only the first reference voltage Vl is input to the non-inverting input terminal + of the first comparator 611.

Figure 7:
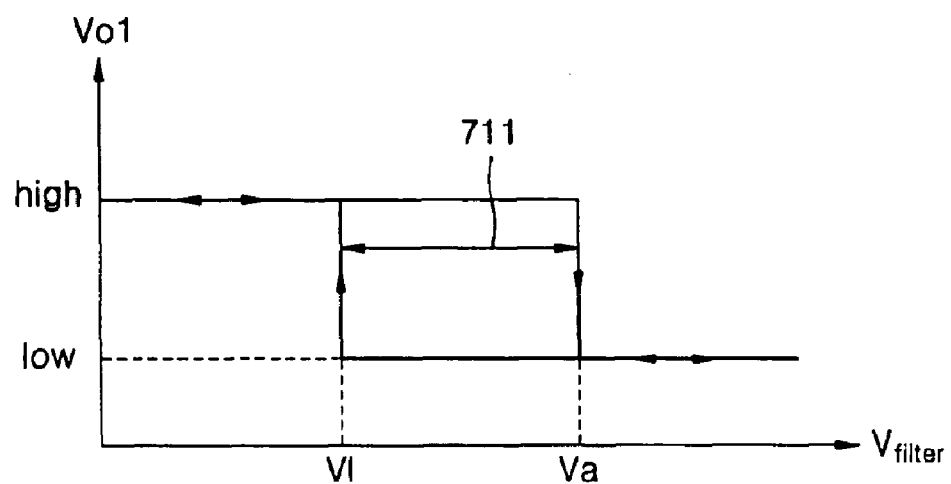
FIG. 7 is a graph illustrating characteristics of an output voltage from a first comparison unit of FIG. 5.

FIG. 7 is a graph illustrating the characteristics of the output voltage Vo1 of the first comparison unit 511. Referring to FIG. 7, when the output voltage Vfilter level of the loop filter 431 increases, the output voltage Vo1 level of the first comparison unit 511 switches from high to low at a predetermined first voltage Va. On the contrary, when the output voltage Vfilter level of the loop filter 431 decreases, the output voltage Vo1 level of the first comparison unit 511 switches from low to high at the first reference voltage Vl. Accordingly, the output voltage Vo1 of the first comparison unit 511 has a hysteresis characteristic. Here, a hysteresis section 711 is determined by the voltage applied to the first resistor 651 of FIG. 6.

Figure 8:
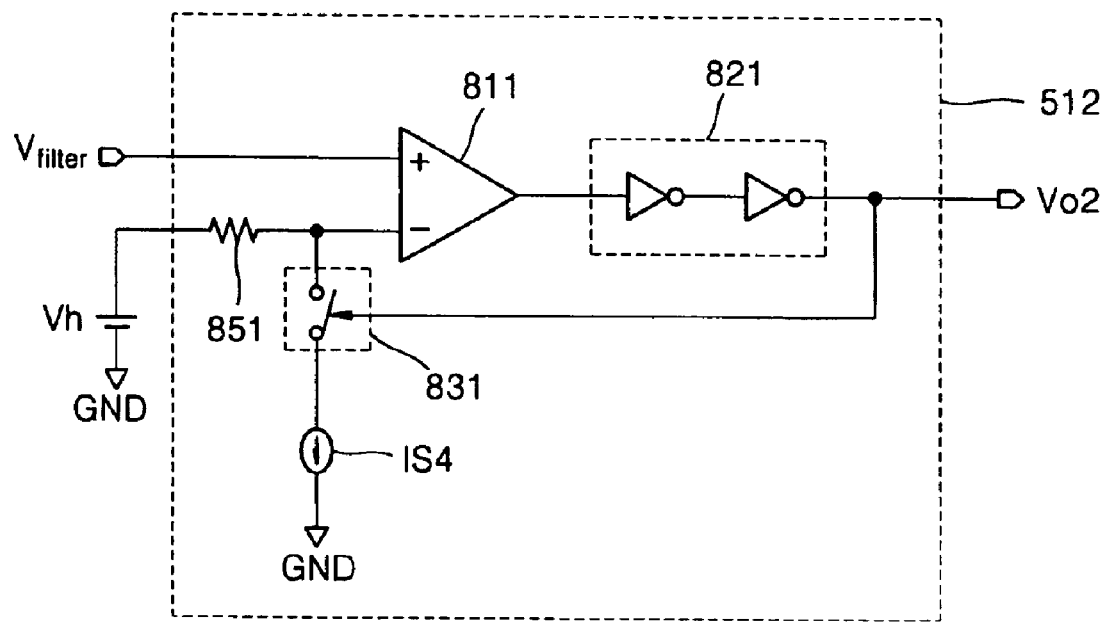
FIG. 8 is a circuit diagram of a second comparison unit of FIG. 5.

FIG. 8 is a circuit diagram illustrating the second comparison unit 512 of FIG. 5. Referring to FIG. 8, the second comparison unit 512 includes a second resistor 851, a fourth switch 831, a fourth current source IS4, a buffer 821, and a second comparator 811.

The second resistor 851 is connected to the second reference voltage Vh, the fourth switch 831 is connected to the second resistor 851, the fourth current source IS4 is connected to the fourth switch 831, and the buffer 821 buffers the output of the second comparator 811.

The second resistor 851 is connected to the inverting input terminal − of the second comparator 811 and the output voltage Vfilter of the loop filter 431 is input to the non-inverting input terminal + of the second comparator 811. When the output voltage Vfilter level of the loop filter 431 is higher than the voltage level input into the inverting input terminal − of the second comparator 811, the second comparator 811 outputs an output voltage Vo2 of high level, for example, the power supply voltage VDD, so as to turn on the fourth switch 831. Accordingly, the second reference voltage Vh is applied to the second resistor 851 and the current flowing through the second resistor 851 flows into the fourth current source IS4 through the fourth switch 831. Therefore, the second reference voltage Vh and the voltage lowered by the second resistor 851 are added and input to the inverting input terminal − of the second comparator 811. When the output voltage Vfilter level of the loop filter 431 is lower than the voltage level input to the inverting input terminal − of the second comparator 811, the second comparator 811 outputs an output voltage Vo2 of low level, for example, the ground voltage GND, so as to turn off the fourth switch 831. Accordingly, only the second reference voltage Vh is input to the inverting input terminal − of the second comparator 811.

Figure 9:
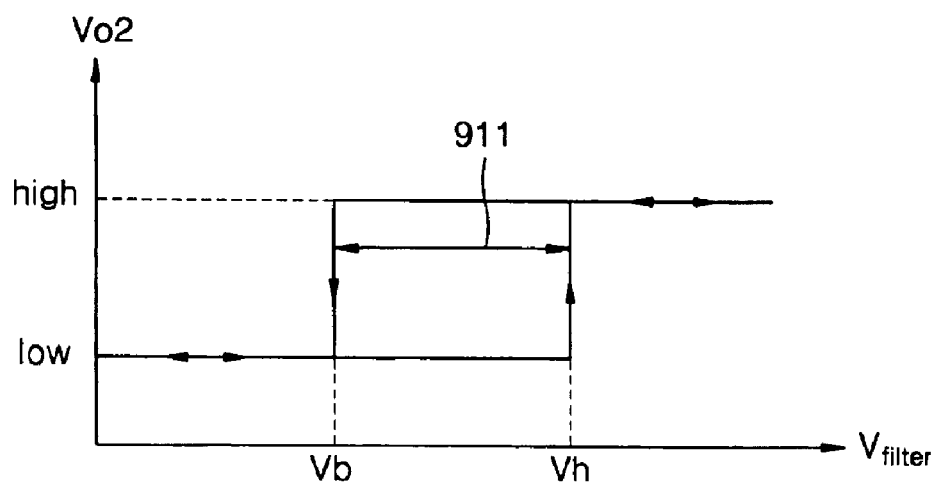
FIG. 9 is a graph illustrating characteristics of an output voltage from a second comparison unit of FIG. 5.

FIG. 9 is a graph illustrating the characteristic of the output voltage Vo2 of the second comparison unit 512. Referring to FIG. 9, when the output voltage Vfilter level of the loop filter 431 increases, the output voltage Vo2 level of the second comparison unit 512 switches from low to high at the second reference voltage Vh. On the contrary, when the output voltage Vfilter level of the loop filter 431 decreases, the output voltage Vo2 level switches from high to low at a predetermined second voltage Vb. Accordingly, the output voltage Vo2 of the second comparison unit 512 has a hysteresis characteristic. Here, a hysteresis section 911 is determined by the voltage applied to the second resistor 851 of FIG. 8.

Figure 10:
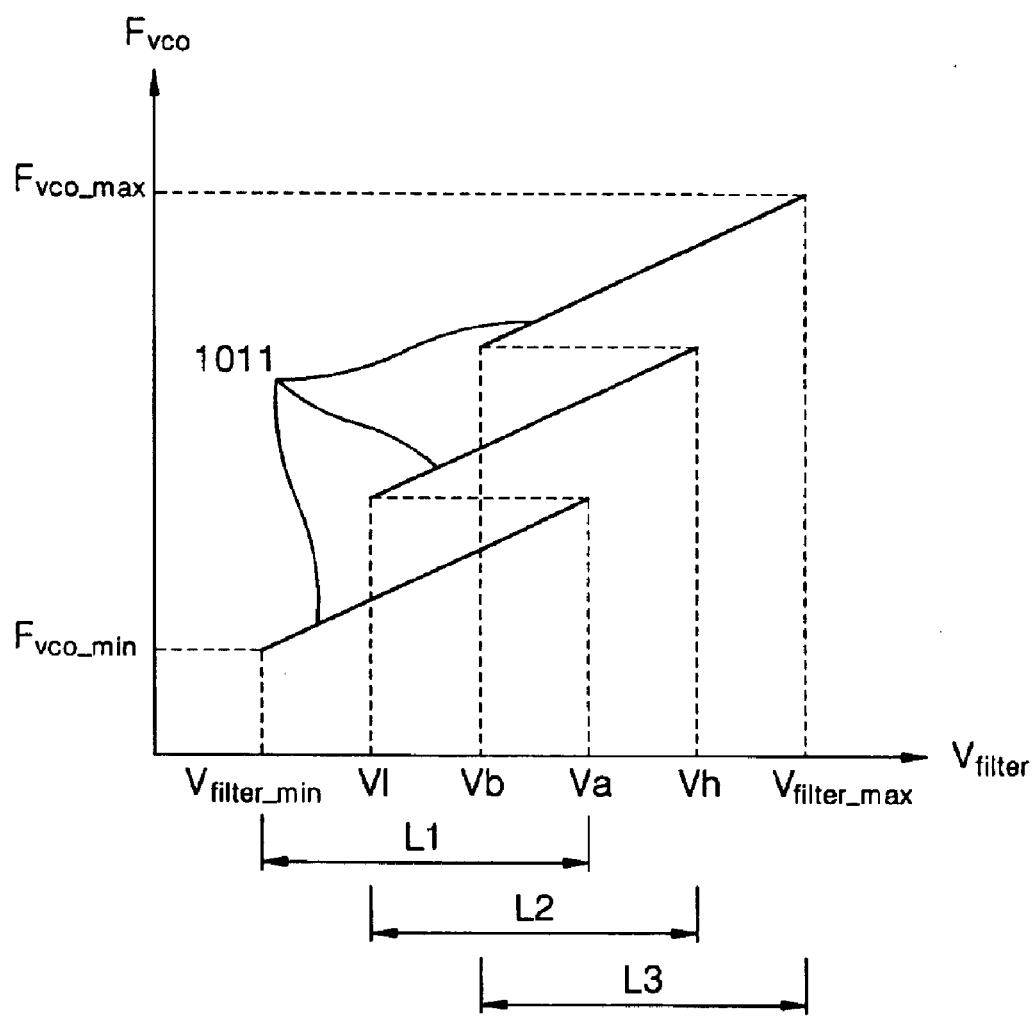
FIG. 10 is a graph illustrating changes in an output signal of a PLL circuit according to variation of an output voltage of a loop filter of FIG. 4.

FIG. 10 is a graph illustrating a characteristic curve of the sensitivity of the output signal Fvco of the PLL circuit 401 according to variation of the output voltage Vfilter level from the loop filter 431 of FIG. 4. The sensitivity 1011 of the output signal Fvco of the PLL circuit 401 shown in FIG. 10 will now be described with reference to FIGS. 4 through 8. Here, the sensitivity 1011 of the output signal Fvco is divided into first through third sections L1 through L3.

The sensitivity 1011 of the output signal Fvco can be divided into a case where the output voltage Vfilter level of the loop filter 431 increases from a minimum voltage Vfilter_min to a maximum voltage Vfilter_max, and a case where the output voltage Vfilter level decreases from the maximum voltage Vfilter_max to the minimum voltage Vfilter_min. Here, since the latter is the opposite of the former, only the former will be described below to avoid redundancy.

In a first section L1, the output voltage Vfilter level of the loop filter 431 starts to increase from the minimum voltage Vfilter_min level and is lowered to the first reference voltage Vl level when reaching the predetermined first voltage Va level.

In a second section L2, the output voltage Vfilter level of the loop filter 431 starts to increase from the first reference voltage Vl level and is lowered to the predetermined second voltage Vb level when reaching the predetermined second reference voltage Vh.

In a third section L3, the output voltage Vfilter level of the loop filter 431 starts to increase from the predetermined second voltage Vb level and stops at the maximum voltage Vfilter_max level.

The reason why the output voltage Vfilter level of the loop filter 431 decreases in the first and second sections L1 and L2 is due to the hysteresis characteristics of the first and second comparison units 511 and 512 of FIG. 5.

Figure 1:
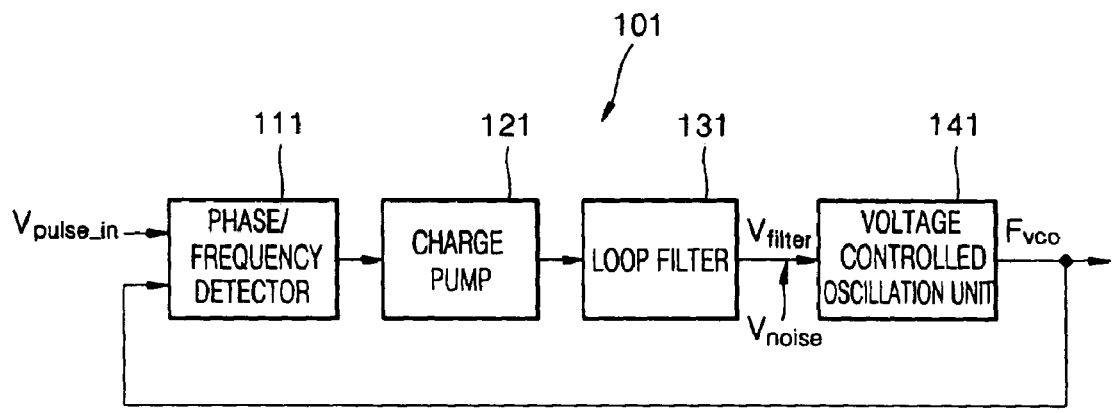
FIG. 1 is a block diagram illustrating a conventional phase locked loop (PLL) circuit.
Figure 2:
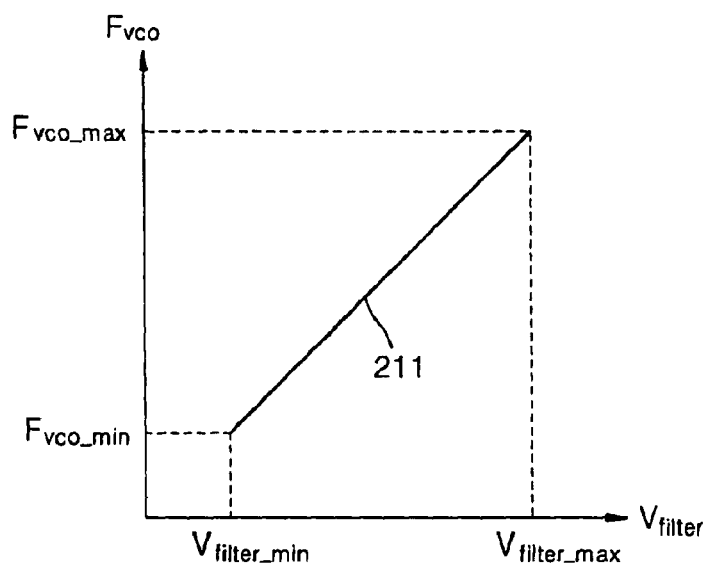
FIG. 2 is a graph illustrating change in an output signal of a PLL circuit according to variation of an output voltage of a loop filter of FIG. 1.

As described above, the gradient of the sensitivity 1011 of the output signal Fvco of the PLL circuit 401 is only one third of the gradient of the sensitivity 211 (refer to FIG. 2) of the output signal Fvco of a conventional PLL circuit 101 (refer to FIG. 1).

Figure 3:
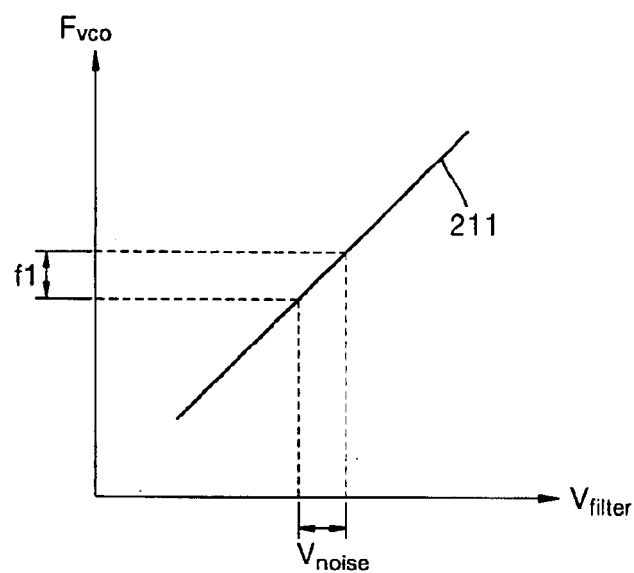
FIG. 3 is a graph illustrating jitter generated in an output signal of a PLL circuit when a noise voltage is input into an output voltage of a loop filter of FIG. 1.
Figure 11:
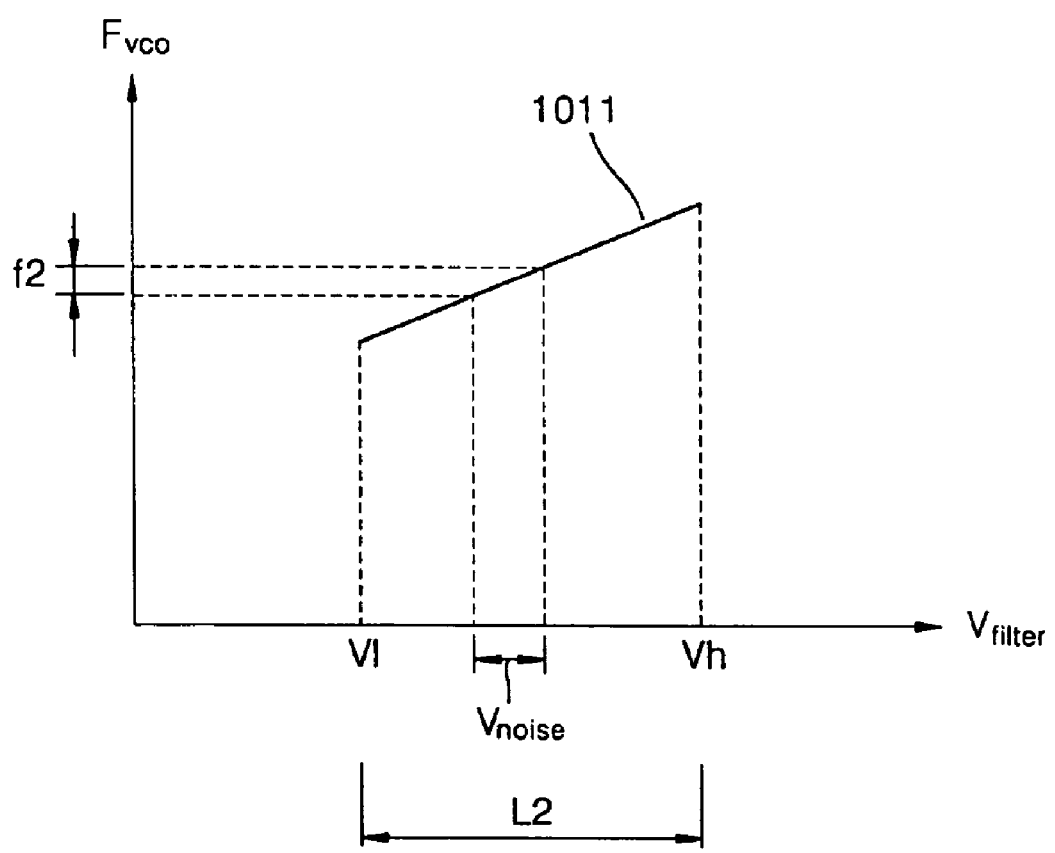
FIG. 11 is a graph illustrating a jitter generated in an output signal of a PLL circuit when a noise voltage is input to an output voltage of a loop filter of FIG. 4.

FIG. 11 is a graph illustrating a jitter generated in the output signal Fvco of the PLL circuit 401 when a noise voltage Vnoise is input to the output voltage Vfilter of the loop filter 431 of FIG. 4. As shown in FIG. 11, since the gradient of the sensitivity 1011 of the output signal Fvco of the PLL 401 is gentle, a jitter f2 generated in the output signal Fvco of the PLL circuit 401 is very small even when the noise voltage Vnoise is induced into the output voltage Vfilter of the loop filter 431. In other words, the jitter f2 generated in the output signal Fvco of the PLL 401 according to the present invention is one third of a jitter f1 (refer to FIG. 3) generated in the output signal Fvco of a conventional PLL circuit 101 (refer to FIG. 1). The sensitivity Fvco_sens of the output signal Fvco of the PLL circuit 401 to the output voltage Vfilter of the loop filter 431 is given by Equation 2.

$$\text{Fvco\_sens [Hz/V]} = \left[\left(\frac{1}{3} \times Vfilter \times Kvi\right) + Idc \pm Ictl\right] \times Kosc \quad (2)$$

Here, Kvi denotes a current Ivi transform coefficient for an input voltage of a conversion unit 531 (refer to FIG. 5). Kosc is a frequency variation correlation coefficient of the oscillator 551 (refer to FIG. 5) for the output current Ivco of the current mirror 541 (refer to FIG. 5). In addition, it is assumed that the sizes of the transistors MP1 and MP2 included in the current mirror 541 in FIG. 5 are the same.

Figure 12:
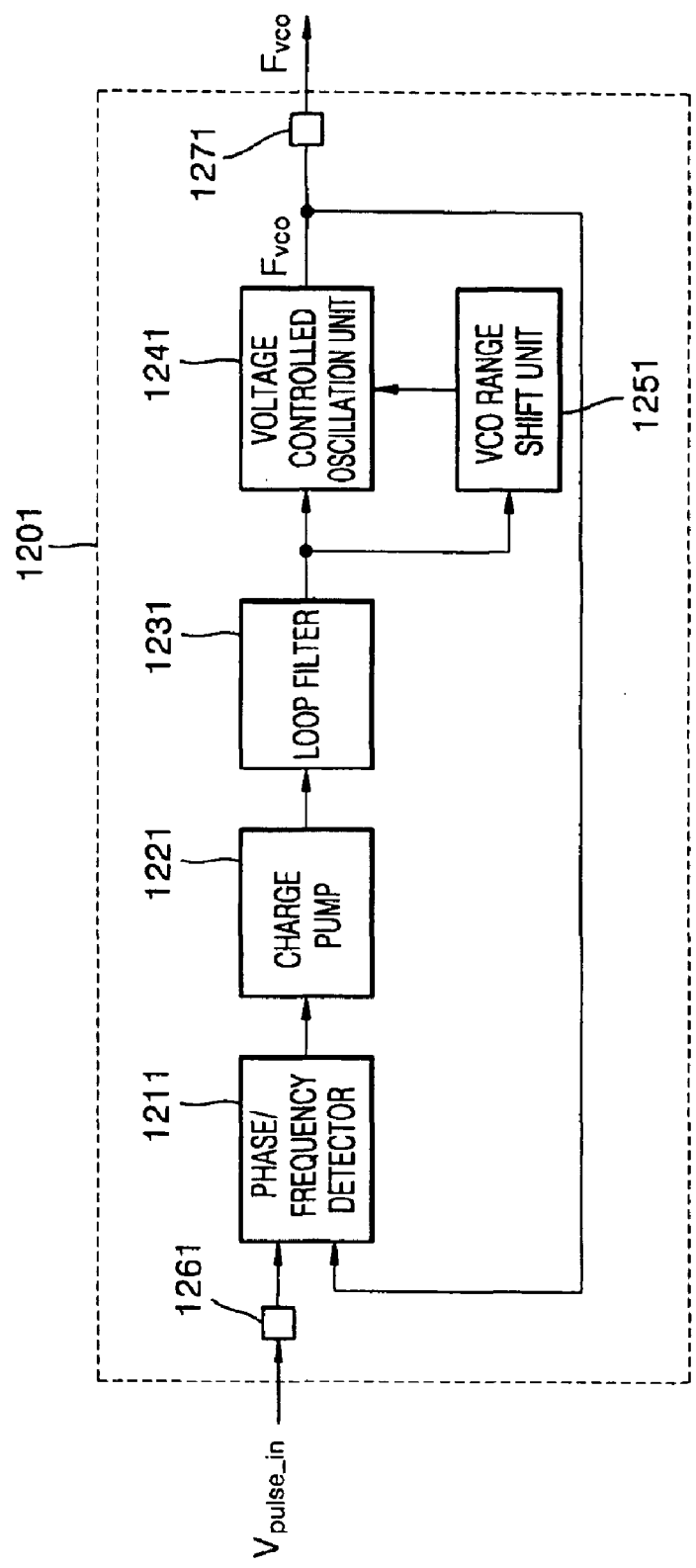
FIG. 12 is a block diagram illustrating a semiconductor integrated circuit (IC) device in which a PLL circuit according to the present invention is embodied.

FIG. 12 is a block diagram illustrating a semiconductor integrated circuit (IC) device in which a PLL circuit according to the present invention is embodied. Referring to FIG. 12, a semiconductor IC device 1201 includes first and second pads 1261 and 1271, a phase/frequency detector 1211, a charge pump 1221, a loop filter 1231, a voltage controlled oscillation unit 1241, and a VCO range shift unit 1251.

The first pad 1261 receives an external signal Vpulse_in and transmits it to the phase/frequency detector 1211.

The second pad 1271 receives an output signal Fvco of the voltage controlled oscillation unit 1241 and transmits it to the outside of the semiconductor IC device 1201.

The phase/frequency detectors 1211 and 411, the charge pumps 1221 and 421, the loop filters 1231 and 431, the voltage controlled oscillation units 1241 and 441, and the VCO range shift units 1251 and 451 of FIGS. 12 and 4, respectively, are the same, and thus descriptions of these components will not be repeated.

The effects of the PLL circuit 401 of FIG. 4 are the same as those of the PLL circuit consisting of reference numerals 1211, 1221, 1231, 1241, and 1251 included in the semiconductor IC device 1201.

Sensitivity sections L1 through L3 shown in FIG. 10 increase with the increase in the numbers of comparison units 511 and 512, switches 521 and 522, and current sources IS1 and IS2 of FIG. 5. Accordingly, the gradient of sensitivity 1011 becomes gentler so that a jitter f2 generated in an output signal Fvco of PLL circuit 401 becomes smaller even when a noise voltage Vnoise is induced into an output voltage Vfilter of a loop filter 431.

According to the present invention, since the sensitivity of an output signal Fvco of PLL circuit 401 shown in FIGS. 4 and 12 is small, a small jitter f2 is generated in the output signal Fvco of the PLL circuit 401 even when a noise voltage Vnoise is induced into an output voltage Vfilter of a loop filter 431. As a result, the PLL circuit 401 is not significantly affected by the noise voltage Vnoise induced into the output voltage Vfilter of the loop filter 431 so that the PLL circuit operates stably.

While this invention has been particularly shown and described with reference to preferred embodiments thereof, the preferred embodiments described above are merely illustrative and are not intended to limit the scope of the invention. It will be understood by those skilled in the art that various changes in form and details may be made therein without departing from the spirit and scope of the invention as defined by the appended claims.

What is claimed is:

1. A phase locked loop (PLL) circuit having a wide locked range, the PLL circuit comprising:
   a phase/frequency detector for detecting a phase difference between an external input signal and an output signal of the PLL circuit;
   a charge pump for increasing or decreasing an output voltage level in response to the output signal of the phase/frequency detector;
   a loop filter for removing a high frequency element from the output voltage of the charge pump;
   a voltage controlled oscillation unit for outputting a signal having a predetermined frequency as an output signal of the PLL circuit in response to the output voltage of the loop filter; and
   a voltage controlled oscillator (VCO) range shift unit for decreasing a sensitivity of the output signal of the PLL circuit to the output voltage of the loop filter by increasing or decreasing an internal current of the voltage controlled oscillation unit in response to the output voltage of the loop filter, the VCO range shift unit including:
   a node connected to the voltage controlled oscillation unit for receiving and outputting an output current of the VCO range shift unit;

a first current source connected to a power supply voltage;
a first switch connected between the first current source and the node;
a second current source connected to the ground voltage;
a second switch connected between the node and the second current source;
a first comparison unit receiving the output voltage of the loop filter and a first reference voltage for turning on the first switch by outputting a high voltage level when the output voltage of the loop filter is lower than the first reference voltage and turning off the first switch according to an opposite state, and having a hysteresis characteristic; and
a second comparison unit receiving the output voltage of the loop filter and a second reference voltage for turning on the second switch by outputting a high voltage level when the output voltage of the loop filter is higher than the second reference voltage and turning off the second switch according to an opposite state, and having a hysteresis characteristic,
wherein the first reference voltage level is lower than the second reference voltage level and the first and second switches are turned off when the output voltage of the loop filter is higher than the first reference voltage and lower than the second reference voltage.

2. The PLL circuit of claim 1, further comprising a frequency divider for dividing the frequency of the output signal of the PLL circuit by a predetermined number and applying the divided frequency to the phase/frequency defector.

3. The PLL circuit of claim 1, wherein an output current of the first current source flows into the voltage controlled oscillation unit when the first switch is turned on and the second switch is turned off,
a predetermined current flows out from the voltage controlled oscillation unit to the second current source when the first switch is turned off and the second switch is turned on, and
no current flows into or out from the voltage controlled oscillation unit when the first and second switches are turned off.

4. The PLL circuit of claim 1, wherein the first comparison unit includes:
a first resistor connected to the first reference voltage;
a third switch connected to the first resistor;
a third current source connected to the third switch; and
a first comparator having an inverting input terminal and a non-inverting input terminal, in which the first resistor is connected to the non-inverting input terminal and the output voltage of the loop filter is input to the inverting input terminal, for turning on the third switch by outputting a high voltage level as an output voltage of the first comparison unit when the output voltage of the loop filter is lower than the voltage input to the non-inverting input terminal so as to allow the output current of the third current source to flow through the first resistor, and for turning off the third switch by outputting a low voltage level as the output voltage of the first comparison unit when the output voltage of the loop filter is higher than the voltage input to the non-inverting input terminal so as to represent a hysteresis characteristic.

5. The PLL circuit of claim 4, wherein the second comparison unit includes:
a second resistor connected to the second reference voltage;
a fourth switch connected to the second resistor;
a fourth current source connected to the fourth switch; and
a second comparator having an inverting input terminal and a non-inverting input terminal, in which the second resistor is connected to the inverting input terminal and the output voltage of the loop filter is input to the non-inverting input terminal, for turning on the fourth switch by outputting a high voltage level as an output voltage of the second comparison unit when the output voltage of the loop filter is higher than the voltage input to the inverting input terminal so as to allow the current flowing through the second resistor to flow into the fourth current source, and for turning off the fourth switch by outputting a low voltage level as the output voltage of the second comparison unit when the output voltage of the loop filter is lower than the voltage input to the inverting input terminal so as to represent a hysteresis characteristic.

6. The PLL circuit of claim 1, wherein the voltage controlled oscillation unit includes:
a conversion unit for converting the output voltage of the loop filter into a current;
a third current source connected to the conversion unit in parallel for outputting a constant current;
a current mirror having a first output terminal connected to the conversion unit; and
an oscillator for outputting an output signal of the PLL circuit in response to an output current of a second output terminal of the current mirror.

7. A semiconductor integrated circuit (IC) device including a PLL circuit having a wide locked range, the semiconductor IC device comprising:
a first pad for receiving an external signal;
a phase/frequency detector for detecting a phase difference between the signal input through the first pad and an output signal of the PLL circuit;
a charge pump for increasing or decreasing an output voltage level in response to the output signal of the phase/frequency detector;
a loop filter for removing a high frequency element from the output voltage of the charge pump;
a voltage controlled oscillation unit for outputting an output signal of the PLL circuit in response to the output voltage of the loop filter;
a second pad for transmitting the output signal of the voltage controlled oscillation unit to the outside; and
a VCO range shift unit for decreasing a sensitivity of the output signal of the PLL circuit to the output voltage of the loop filter by increasing or decreasing an internal current of the voltage controlled oscillation unit in response to the output voltage of the loop filter, the VCO range shift unit including:
a node connected to the voltage controlled oscillation unit for receiving and outputting an output current of the VCO range shift unit;
a first current source connected to a power supply voltage;
a first switch connected between the first current source and the node;
a second current source connected to the ground voltage;
a second switch connected between the node and the second current source;
a first comparison unit receiving the output voltage of the loop filter and a first reference voltage for turning on the first switch by outputting a high voltage level when the output voltage of the loop filter is lower than the first reference voltage and turning off the first switch according to an opposite state, and having a hysteresis characteristic; and a second comparison unit receiving the output voltage of the loop filter and a second reference voltage for turning on the second switch by outputting a high voltage level when the output voltage of the loop filter is higher than the second reference voltage and turning off the second switch according to an opposite state, and having a hysteresis characteristic, wherein the first reference voltage level is lower than the second reference voltage level and the first and second switches are turned off when the output voltage of the loop filter is higher than the first reference voltage and lower than the second reference voltage.

8. The semiconductor IC device of claim 7, further comprising a frequency divider for dividing the frequency of the output signal of the PLL circuit by a predetermined number and applying the divided frequency to the phase/frequency detector.

9. The semiconductor IC device of claim 7, wherein an output current of the first current source flows into the voltage controlled oscillation unit when the first switch is turned on and the second switch is turned off, a predetermined current flows out from the voltage controlled oscillation unit to the second current source when the first switch is turned off and the second switch is turned on, and no current flows into or out from the voltage controlled oscillation unit when the first and second switches are turned off.

10. The semiconductor IC device of claim 7, wherein the first comparison unit includes:

a first resistor connected to the first reference voltage;

a third switch connected to the first resistor;

a third current source connected to the third switch; and a first comparator having an inverting input terminal and a non-inverting input terminal, in which the first resistor is connected to the non-inverting input terminal and the output voltage of the loop filter is input to the inverting input terminal, for turning on the third switch by outputting a high voltage level as an output voltage of the first comparison unit when the output voltage of the loop filter is lower than the voltage input to the non-inverting input terminal so as to allow the output current of the third current source to flow through the first resistor, and for turning off the third switch by outputting a low voltage level as the output voltage of the first comparison unit when the output voltage of the loop filter is higher than the voltage input to the non-inverting input terminal so as to represent a hysteresis characteristic.

11. The semiconductor IC device of claim 10, wherein the second comparison unit includes:

a second resistor connected to the second reference voltage;

a fourth switch connected to the second resistor;

a fourth current source connected to the fourth switch; and a second comparator having an inverting input terminal and a non-inverting input terminal, in which the second resistor is connected to the inverting input terminal and the output voltage of the loop filter is input to the non-inverting input terminal, for turning on the fourth switch by outputting a high voltage level as an output voltage of the second comparison unit when the output voltage of the loop filter is higher than the voltage input to the inverting input terminal so as to allow the current flowing through the second resistor to flow into the fourth current source, and for turning off the fourth switch by outputting a low voltage level as the output voltage of the second comparison unit when the output voltage of the loop filter is lower than the voltage input to the inverting input terminal so as to represent a hysteresis characteristic.

12. The semiconductor IC device of claim 7, wherein the voltage controlled oscillation unit includes:

a conversion unit for converting the output voltage of the loop filter into a current;

a third current source connected to the conversion unit in parallel for outputting a constant current;

a current mirror having a first output terminal connected to the conversion unit; and an oscillator for outputting an output signal of the PLL circuit in response to an output current of a second output terminal of the current mirror.

13. A phase locked loop (PLL) circuit having a wide locked range, the PLL circuit comprising:

a phase/frequency detector for detecting a phase difference between an external input signal and an output signal of the PLL circuit;

a charge pump for increasing or decreasing an output voltage level in response to the output signal of the phase/frequency detector;

a loop filter for removing a high frequency element from the output voltage of the charge pump;

a voltage controlled oscillation unit for outputting a signal having a predetermined frequency as an output signal of the PLL circuit in response to the output voltage of the loop filter; and a voltage controlled oscillator (VCO) range shift unit for decreasing a sensitivity of the output signal of the PLL circuit to the output voltage of the loop filter by increasing or decreasing an internal current of the voltage controlled oscillation unit in response to the output voltage of the loop filter; wherein the voltage controlled oscillation unit includes:

a conversion unit for converting the output voltage of the loop filter into a current;

a current source connected to the conversion unit in parallel for outputting a constant current;

a current mirror having a first output terminal connected to the conversion unit; and an oscillator for outputting an output signal of the PLL circuit in response to an output current of a second output terminal of the current mirror.

14. A semiconductor integrated circuit (IC) device including a PLL circuit having a wide locked range, the semiconductor IC device comprising:

a first pad for receiving an external signal;

a phase/frequency detector for detecting a phase difference between the signal input through the first pad and an output signal of the PLL circuit;

a charge pump for increasing or decreasing an output voltage level in response to the output signal of the phase/frequency detector;

a loop filter for removing a high frequency element from the output voltage of the charge pump;

a voltage controlled oscillation unit for outputting an output signal of the PLL circuit in response to the output voltage of the loop filter;

a second pad for transmitting the output signal of the voltage controlled oscillation unit to the outside; and a VCO range shift unit for decreasing a sensitivity of the output signal of the PLL circuit to the output voltage of the loop filter by increasing or decreasing an internal current of the voltage controlled oscillation unit in response to the output voltage of the loop filter; wherein the the voltage controlled oscillation unit includes:

a conversion unit for converting the output voltage of the loop filter into a current;

a current source connected to the conversion unit in parallel for outputting a constant current;

a current mirror having a first output terminal connected to the conversion unit; and an oscillator for outputting an output signal of the PLL circuit in response to an output current of a second output terminal of the current mirror.

* * * * *

UNITED STATES PATENT AND TRADEMARK OFFICE
CERTIFICATE OF CORRECTION

PATENT NO. : 6,856,204 B2
DATED : February 15, 2005
INVENTOR(S) : Hyeok-chul Kwon It is certified that error appears in the above-identified patent and that said Letters Patent is hereby corrected as shown below:

Column 11,
Line 30, please delete "defector" and insert -- detector --.

Signed and Sealed this

Twenty-first Day of June, 2005

JON W. DUDAS
*Director of the United States Patent and Trademark Office*